United States Patent

Pakeriasamy et al.

[11] Patent Number: 5,979,660
[45] Date of Patent: Nov. 9, 1999

[54] TUBE FOR FLASH MINIATURE CARD

[75] Inventors: Saragarvani Pakeriasamy, San Jose, Calif.; Mohd Alkhadzari Harun, Penang, Malaysia

[73] Assignee: Advanced Micro Devices, Inc., Sunnyvale, Calif.

[21] Appl. No.: 08/870,045

[22] Filed: Jun. 5, 1997

[51] Int. Cl.$^6$ .................................................. B65D 73/02
[52] U.S. Cl. .......................................................... 206/718
[58] Field of Search ...................... 206/328, 701, 206/713, 718; 361/212, 220, 679; 220/DIG. 19

[56] References Cited

U.S. PATENT DOCUMENTS

| | | |
|---|---|---|
| 4,565,288 | 1/1986 | Walther . |
| 4,690,274 | 9/1987 | Lue ........................................ 206/328 |
| 4,721,206 | 1/1988 | Votter . |
| 4,866,574 | 9/1989 | Hsiung . |
| 4,903,380 | 2/1990 | Kirby ........................................ 24/453 |
| 5,133,452 | 7/1992 | Ohashi . |
| 5,242,051 | 9/1993 | Murphy . |
| 5,435,446 | 7/1995 | Hosseinmardi et al. ................ 206/713 |
| 5,702,005 | 12/1997 | Pakerisamy et al. . |

FOREIGN PATENT DOCUMENTS 57-222059  12/1982  Japan .
63-281978  11/1988  Japan .

*Primary Examiner*—David T. Fidei
*Attorney, Agent, or Firm*—Davis Chin

[57] ABSTRACT

A chip carrier tube for packing and shipping of Flash miniature cards in a side-by-side arrangement includes a tubular body member (24), a first end stop member (26a), and a second end stop member (26b). The tubular body member has a first end and a second end. The tubular body member has a bore of a rectangular cross-section extending therethrough between the first end and the second end. The tubular body member includes an upper wall section (34), a lower wall section (36), and a pair of opposed side walls (38,40) all integrally connected together. There are provided a stepped end portion (50) formed on the lower wall section for supporting only a small portion of the bottom surface adjacent to the side edge opposite to a plurality of terminal leads of the miniature cards and a rib member supporting the plurality of terminal leads so that top and bottom surfaces thereof are substantially suspended freely between raised mid-portions on the respective upper and lower wall sections of the tubular member. As a result, triboelectric charge and removal of anti-static coating will be minimized due to less contact between the card surfaces and the interior surfaces of the tubular member.

9 Claims, 2 Drawing Sheets

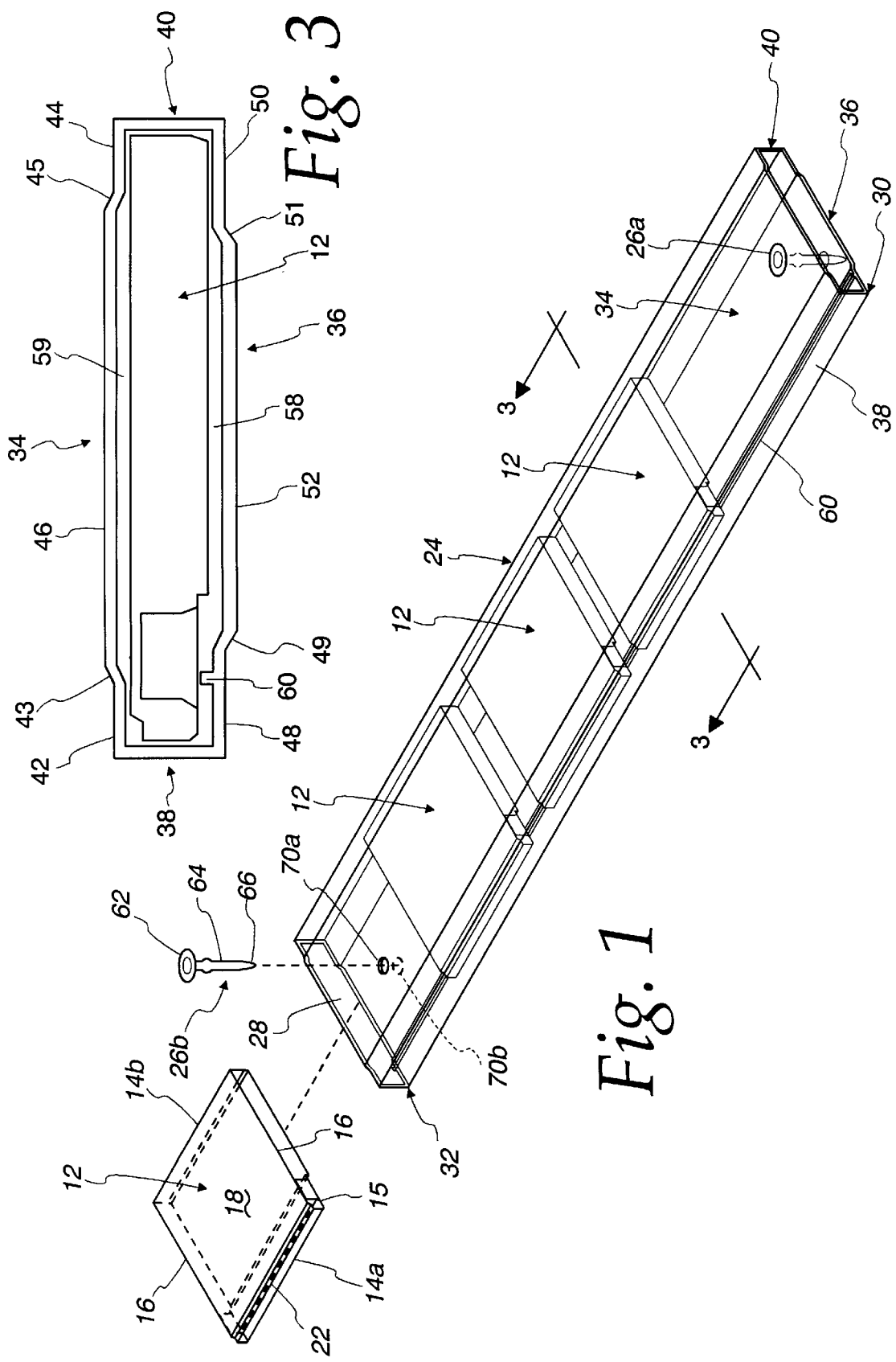

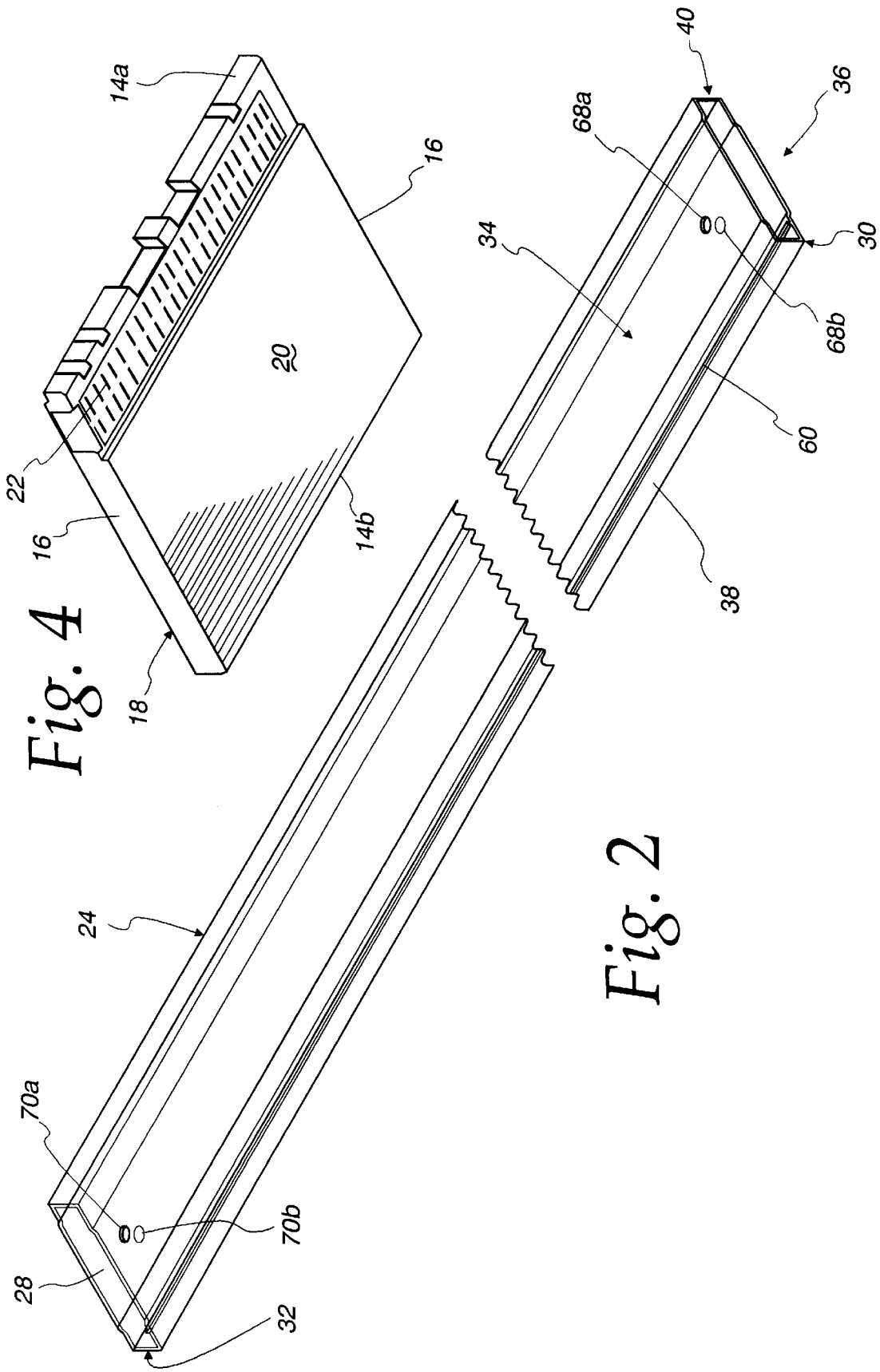

TUBE FOR FLASH MINIATURE CARD

BACKGROUND OF THE INVENTION

This invention relates generally to containers for shipping and storing semiconductor integrated circuits and more particularly, it relates to a chip carrier tube of a novel construction adapted for especially packing and shipping a plurality of Flash miniature cards in a side-by-side arrangement.

In view of the trend for higher and higher packing densities for semiconductor memory integrated circuits or chips, there has been developed in recent years in the industry extremely miniaturized rectangularly-shaped packages of the types referred to as miniature cards. Consequently, there has arisen a need for chip carrier tubes or containers for housing and/or shipping a relatively large number of these miniature cards so as to facilitate their storage and transportation from a chip manufacturer's site to a customer's plant for use in a manufacturing process and/or equipment.

Since these miniature cards are susceptible to possible physical damage or even destruction during packaging and subsequent shipment, the chip carrier tubes must also be capable of providing a degree of protection for the sensitive miniature cards to be transported therein with respect to contamination, triboelectric charge caused by contact between the miniature card surface and the tube surface, electrostatic discharge (ESD), variations in temperature, and mechanical vibration or shock.

Currently, the prior art solutions to these problems have involved the use of plastic cases each having a compartment for holding a single or individual miniature card therein. However, the prior art plastic cases suffer from the disadvantage of being a very time-consuming task for loading and packing the individual miniature cards. Further, the use of an individual plastic case for each miniature card increases the material cost as well as the assembly/labor cost. In addition, the plastic cases are not very practical to use with other sequential manufacturing processes and/or equipment, such as a "pick and place" mechanism.

In U.S. Pat. No. 5,435,446 to M. Hosseinmardi et al. issued on Jul. 25, 1995, and assigned to the same assignee as the present invention, there is disclosed a BGA carrier for storing and shipping of BGA packages in a side-by-side arrangement, which is hereby incorporated in its entirety by reference. The BGA carrier is also adapted for dispensing of the BGA packages in a one-by-one fashion under gravity. The BGA carrier includes a flat elongated tubular body member, a lower end plug member, and an upper end plug member. The tubular body member has a first end and a second end. The tubular body member has a bore of a rectangular cross-section extending therethrough between the first end and the second end. The tubular body member includes a flat top wall portion, a flat bottom wall portion, and a pair of vertically extending side walls all formed integrally together. Opposed overhanging slots are formed in the pair of vertically extending side walls for supporting only two side edges of a plurality of BGA packages so that the top and bottom surfaces thereof are suspended freely between the top and bottom wall portions of the tubular body member.

In co-pending application Ser. No. 08/614,755 filed on Mar. 13,1966, there is illustrated a chip carrier container for storing and shipping of a plurality of PLCC/LCC packages in a side-by-side arrangement which includes a tubular body member, a first end plug member, and a second end plug member. The tubular body member has a first end and a second end. The tubular body member also includes a bore of a substantially rectangular cross-section extending therethrough between the first end and the second end. The tubular body member is formed of an upper wall section, a lower wall section, and a pair of opposed side walls all integrally connected together. The first end plug member is disposed slidably and frictionally into the bore adjacent the first end of the tubular body member. A plurality of PLCC/LCC packages are disposed upside down in the bore of the tubular body member to substantially fill the same. Each of the PLCC/LCC packages is of a substantially rectangular shape and has side edges, end edges, a top surface, and a bottom surface. The side and end edges are provided with terminal leads.

The upper wall section includes a first flat end portion, a second flat end portion, and an offset intermediate portion sandwiched between the first and second end portions. Similarly, the lower wall section has a first flat end portion, a second flat end portion, and an offset intermediate portion sandwiched between the first and second end portions. The first and second end portions on the lower wall section are used to support only small portions of the top surface adjacent to the side edges of the plurality of PLCC/LCC packages so that the top and bottom surfaces thereof are substantially suspended freely between the offset intermediate portions on the upper and lower wall sections of the tubular member. The second end plug member is disposed slidably and frictionally into the bore adjacent the second end of the tubular body member.

Nevertheless, at the present time the inventors are unaware of the use of tubes for packing Flash miniature cards in the industry. Accordingly, it would be desirable to provide a chip carrier of a tubular construction adapted for especially packing and shipping a plurality of Flash miniature cards in a side-by-side arrangement which requires a lesser amount of time to load and pack. Further, it would be expedient to provide a chip carrier which can be made relatively less expensive and is compatible with other manufacturing processes and/or equipment for sequential assembly operations.

SUMMARY OF THE INVENTION

Accordingly, it is a general object of the present invention to provide an improved Flash miniature card container of a tubular construction which is relatively simple and economical to manufacture and assemble, but yet overcomes the disadvantages of the prior art plastic cases.

It is an object of the present invention to provide an improved chip carrier tube of a unique construction for storing and shipping Flash miniature cards in a side-by-side arrangement so as to protect the same from damage or possible destruction during packing and shipment.

It is another object of the present invention to provide an improved chip carrier tube for storing and shipping of a plurality of Flash miniature cards so as to produce less contact with the card surfaces, thereby reducing friction and minimizing the build-up of tribo-electric charge between the tube surfaces and the card surfaces.

It is still another object of the present invention to provide an improved chip carrier tube for packing and shipping of a plurality of Flash miniature cards which includes upper and lower wall sections each having a first stepped end portion, a first angled connecting portion, a slightly raised midportion, a second angled connecting portion, and a second flat end portion.

It is still yet another object of the present invention to provide an improved chip carrier tube for packing and shipping of a plurality of Flash miniature cards which reduces packing cost and simplifies the loading and packing process.

In a preferred embodiment of the present invention, there is provided a chip carrier container for packing and shipping a plurality of Flash miniature cards in a side-by-side arrangement which includes a tubular body member, a first end stop member, and a second end stop member. The tubular body member has a first end and a second end. The tubular body member also includes a bore of a substantially rectangular cross-section extending therethrough between the first end and the second end. The tubular body member is formed of an upper wall section, a lower wall section, and a pair of opposed side walls all integrally connected together. The first end stop member is disposed adjacent the first end of the tubular member. A plurality of Flash miniature cards are disposed in an upright position in the bore of the tubular body member to substantially fill the same. Each of the miniature cards is of a substantially rectangular shape and has side edges, a top surface, and a bottom surface. A plurality of terminal leads are formed adjacent one of the side edges on the bottom surface.

The upper wall section includes a first stepped end portion, a first angled connecting portion, a slightly raised mid-portion, a second angled connecting portion, and a second stepped end portion disposed between the opposed side walls. Similarly, the lower wall section has a first stepped end portion, a first angled connecting portion, a slightly raised mid-portion, a second angled connecting portion, and a second stepped end portion disposed between the opposed side walls. A narrow rib member is formed on the interior surface of the first stepped end portion of the lower wall section. The second stepped end portion on the lower wall section is used to support only a small portion of the bottom surface adjacent to the side edge opposite to the plurality of terminal leads of the plurality of miniature cards and the rib member supports the plurality of terminal leads so that the top and bottom surfaces thereof are substantially suspended freely between the mid-portions on the upper and lower wall section s of the tubular member. The second end stop member is disposed adjacent the second end of the tubular body member.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is an exploded, perspective view of Flash miniature card container, constructed in accordance with the principles of the present invention;

FIG. 2 is a perspective view, similar to FIG. 1, except with the end stop members and miniature cards being removed;

FIG. 3 is a cross-sectional view, taken along the lines 3—3 of FIG. 1; and

FIG. 4 is an enlarged, perspective view of a Flash miniature card.

DESCRIPTION OF THE PREFERRED EMBODIMENT

Referring now in detail to the drawings, there is shown in FIGS. 1 through 3 a novel chip carrier tube or container designated generally by reference numeral 10 and constructed in accordance with the principles of the present invention. The chip carrier tube 10 is adapted for especially packing and shipping a plurality of Flash miniature cards 12 in a side-by-side arrangement. Each of the miniature card s 12 (one of which is illustrated in detail in FIG. 4) is of a substantially rectangular configuration having opposed side edges 14a and 14b, opposed end edges 16, a top surface 18, and a bottom surface 20. Adjacent the side 14a in a recess 15 formed in the bottom surface 20, there are provided a plurality of terminals leads 22 which extend between the opposed end edges 16. The Flash miniature cards 12 may be similar to 5 Volt-Only, 8 Mbyte memory card, which is commercially available from Advanced Micro Devices, Inc. of Sunnyvale, Calif. under their Part No. 9648AUA.

The chip carrier tube 10 is comprised of a tubular body member 24 and a pair of end stop members 26a, 26b. The tubular body member 24 has a bore 28 of a substantially rectangular cross-section extending therethrough between a first end 30 and a second end 32. The tubular body member is of a unitary construction and is formed of a suitable plastic film material such as polyvinyl chloride (PVC), polycarbonate, polyethylene, or the like which may be extruded and vacuum or pressure formed to the desired shape. The plastic material is preferably treated or coated with an appropriate additive so as to render it anti-static or static-dissipative as required. While the body member may be of various dimensions, the opposed side walls thereof are designed to be spaced apart so as to conform to the contour of the miniature cards and the length is such that a predetermined quantity of the miniature cards can be stored or housed therein. For example, the body member is typically made long enough so as to store twelve miniature cards.

The body member further includes an upper wall section 34, a lower wall section 36, and a pair of opposed side walls 38, 40 all integrally connected together. As is illustrated in the preferred embodiment, the upper and lower wall sections 34 and 36 are disposed parallel to each other and extend longitudinally between the first and second ends 30, 32. Each of the upper and lower wall sections 34, 36 has a length of approximately 508 mm. The upper wall section 34 includes a first stepped end portion 42, a first angled connecting portion 43, a slightly raised mid-portion 46, a second angled connecting portion 45, and a second stepped end portion 44 disposed between the opposed side walls 38, 40. Similarly, the lower wall section 36 includes a first stepped end portion 48, a first angled connecting portion 49, a slightly raised mid-portion 52, a second angled connecting portion 51, and a second stepped end portion 50 disposed between the opposed side walls 38, 40.

The first and second end portions 42, 44 of the upper wall section 34 have a dimension of about 3.81 mm. The first and second end portions 48, 50 of the lower wall section 36 have a dimension of about 6.73 mm. The raised mid-portion 46 has a dimension of about 24.60 mm. The raised mid-portion 52 has a dimension of about 18.80 mm. The opposite first end portions 42 and 48 are spaced from each other by a distance of approximately 4.69 mm. The opposite second end portions 44 and 50 are also spaced apart by a distance of approximately 4.69 mm. The slightly raised mid-portions 46 and 52 are spaced apart from each other by a distance of about 5.71 mm.

The opposed side walls 38 and 40 are spaced apart from each other by a distance of approximately 34.29 mm. The side wall 38 is joined to the opposite first end portions 42 and 48. Similarly, the side wall 40 is joined integrally to the opposite second end portions 44 and 50. The thickness of the upper wall section 34, lower wall section 36, and side walls 38, 40 is approximately 0.635 mm.

As can best be seen from FIG. 3, a narrow rib member 60 is formed on the inner surface of the first stepped end portion 48 of the lower wall section 36 and projects upwardly therefrom. The rib member 60 also extends longitudinally between the first and second ends 30,32. The rib member 60 is substantially aligned with the first angled connecting portion 43 of the upper wall section 34 and has a height dimension of approximately 0.635 mm. When the Flash miniature cards 12 are placed in an upright position in a side-by-side arrangement within the present tubular body member 24 of FIG. 3 only a small portion of the bottom surface 20 adjacent to the side edge 14b of the miniature cards 12 are in physical contact or engageable with the internal surfaces of the second stepped end portions 50 of the lower wall section 36 of the tubular member. Further, the rib member serves to support and is engageable with the terminal leads 22 adjacent the side edge 14a in the recess 15 of the miniature cards.

Consequently, there is less physical contact between the internal tubular body member surfaces and the card surface, thereby reducing friction therebetween. This serves to minimize the build-up of triboelectric charge and the removal of the anti-static coating. It will be appreciated that the rib member 60 also functions to control the orientation of the miniature cards 12 during loading into the tubular body member 24 so that the terminal leads thereof will be maintained on the left side and to maintain the miniature cards in a level horizontal position, as illustrated in FIG. 3. In addition, it can be seen that a gap 58 is created between the bottom surface 20 of the miniature card 12 and the internal surface of the raised mid-portion 52 on the lower wall section 36. Likewise it can be seen that a gap 59 is created between the top surface 18 of the miniature card 12 and the internal surface of the raised mid-portion 46 on the upper wall section 34.

With reference to FIG. 1, it can be seen that each of the end stop members 26a,26b has nail-shaped configuration and is comprised of a head portion 62 and a stem portion 64 joined to the lower surface of the head portion 62. The stem portion 64 terminates in a tip member 66. In use, the tip member 66 on the stem portion 64 of the first end stop member 26a is initially inserted and pressed fitted into aligned openings 68a, 68b formed in respective mid-portions in the upper and lower wall sections 34, 36. As a result, the lower surface of the head portion will rest against the outer surface of the mid-portion of the upper wall section. A predetermined number (i.e., twelve) of Flash miniature cards 12 is then loaded in the upright position into the tubular body member 24 so as to substantially fill the same, up to the aligned openings 70a, 70b formed in the respective mid-portions of the upper and lower wall sections. Next, the second end stop member 26b is inserted and press fitted into the aligned openings 70a, 70b. In this manner, the tubular body member is closed by the first and second end stop members 26a, 26b so as to hold the miniature cards 12 immovable therein against undesirable free movement. Thus, shock and potential physical damage to the miniature cards 12 will be substantially reduced during commercial packing and shipment.

From the foregoing detailed description, it can thus be seen that the present invention provides an improved chip carrier tube of a unique construction for packing and shipping of miniature cards in a side-by-side arrangement so as to protect the same from damage or possible destruction during packing and shipment. The miniature card container of the present invention includes means for supporting only a small portion of the bottom surface adjacent to the one side edge and the terminal leads on the other side edge of the miniature card so that its top and bottom surfaces are substantially suspended freely between mid-portions on respective upper and lower wall sections of a tubular body member.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A chip carrier tube for packing and shipping of a plurality of Flash miniature cards in a side-by-side arrangement, said carrier tube comprising:

a tubular body member (24) having a first end (30) and a second end (32);

said tubular body member having a bore of a substantially rectangular cross-section extending therethrough between said first end and said second end;

said tubular body member including an upper wall section (34), a lower wall section (36), and a pair of opposed side walls (38,40) all integrally connected together;

a first end stop member (26a) disposed adjacent said first end of said tubular body member;

a plurality of Flash miniature cards (12) disposed in an upright position in the bore of said tubular body member to substantially fill the same, each of said miniature cards being of a substantially rectangular shape and having opposed side edges, opposed end edges, a top surface, and a bottom surface, each of said miniature cards having a plurality of terminal leads formed adjacent one of its side edges on the bottom surface;

said upper wall section having a first flat stepped portion (42), a first angled connecting portion (43), a slightly raised mid-portion (46), a second angled connecting portion (45), and a second stepped end portion (44) disposed between said opposed side walls;

said lower wall section having a first flat stepped portion (48), a first angled connecting portion (49), a slightly raised mid-portion (52), a second angled connecting portion (51), and a second stepped end portion (50) disposed between said opposed side walls;

a narrow rib member (60) being formed on the interior surface of said first stepped end portion of said lower section;

said second stepped end portions (50) on said lower wall section (36) supporting only a small portion of said bottom surface adjacent to said side edge (14b) opposite to said plurality of terminal leads of said plurality of miniature cards and said rib member (60) supporting said plurality of terminal leads so that the top and bottom surfaces (18,20) thereof are substantially suspended freely between said raised mid-portions (46,52) on said respective upper and lower wall sections (34, 36) of said tubular body member; and a second end stop member (26b) disposed adjacent said second end of said tubular body member.

2. A chip carrier tube as claimed in claim 1, wherein said tubular body member is formed of a plastic film material.

3. A chip carrier tube as claimed in claim 1, wherein said tubular body member is formed of polyvinyl chloride.

4. A chip carrier tube as claimed in claim 1, wherein each of said first and second end stop members is formed of a nailed-shaped configuration and includes a head portion and a stem portion joined to the lower surface of said head portion.

5. A chip carrier tube as claimed in claim 1, wherein said rib member serves to control the orientation of said miniature card during loading into said tubular body member and to maintain said miniature card in a level horizontal position.

6. A chip carrier tube as claimed in claim 5, wherein said rib member is substantially aligned with said first connecting portion on said upper wall portion.

7. A chip carrier tube as claimed in claim 1, wherein said mid-portion of said upper wall section has a width dimension larger than the width dimension of said mid-portion on said lower wall portion.

8. A chip carrier tube as claimed in claim 7, wherein said width dimension of said mid-portion of said upper wall portion is approximately 24.6 mm.

9. A chip carrier tube as claimed in claim 8, wherein said width dimension of said mid-portion of said lower wall portion is approximately 18.8 mm.

* * * * *

UNITED STATES PATENT AND TRADEMARK OFFICE
CERTIFICATE OF CORRECTION

PATENT NO : 5,979,660
DATED : November 9, 1999
INVENTOR(S): S. Pakeriasamy et al.

It is certified that error appears in the above-identified patent and that said Letters Patent is hereby corrected as shown below:

Column 3, line 42, change "section s" to -- sections --.

Signed and Sealed this

Ninth Day of May, 2000

Attest:

Q. TODD DICKINSON

Attesting Officer

Director of Patents and Trademarks